(12) United States Patent
Song

(10) Patent No.: US 9,959,936 B1
(45) Date of Patent: May 1, 2018

(54) TEMPERATURE-BASED MEMORY ACCESS

(71) Applicant: Marvell International Ltd., Hamilton (BM)

(72) Inventor: Jong-uk Song, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days. days.

(21) Appl. No.: 14/643,751

(22) Filed: Mar. 10, 2015

Related U.S. Application Data

(60) Provisional application No. 61/952,085, filed on Mar. 12, 2014.

(51) Int. Cl.
*G11C 29/12* (2006.01)
*G06F 12/02* (2006.01)

(52) U.S. Cl.
CPC ...... *G11C 29/12005* (2013.01); *G06F 12/023* (2013.01); *G06F 2212/1044* (2013.01)

(58) Field of Classification Search
CPC ........ G06F 3/0653; G06F 1/206; G06F 12/16; G06F 3/0608; G06F 3/0649; G06F 3/0688; G06F 12/0246; G06F 2212/222; G06F 3/064; G06F 3/0616; G06F 3/0659; G06F 3/0679
See application file for complete search history.

(56) References Cited

U.S. PATENT DOCUMENTS

| | | | | |
|---|---|---|---|---|
| 8,315,746 B2* | 11/2012 | Cox | ........................ | G06F 1/203 320/144 |
| 8,487,959 B1* | 7/2013 | Khan | ...................... | G06T 11/00 345/619 |
| 9,086,954 B2* | 7/2015 | Yeh | ...................... | G06F 12/0246 |
| 2009/0299543 A1* | 12/2009 | Cox | ........................ | G06F 1/203 700/299 |
| 2010/0191999 A1* | 7/2010 | Jeddeloh | ................ | G06F 1/3225 713/340 |
| 2010/0192041 A1* | 7/2010 | Jeddeloh | ............ | G11C 29/4401 714/763 |
| 2011/0264843 A1* | 10/2011 | Haines | ................ | G06F 12/0246 711/103 |
| 2012/0224425 A1* | 9/2012 | Fai | ...................... | G11C 11/5642 365/185.09 |
| 2013/0041513 A1* | 2/2013 | Cox | ........................ | G06F 1/203 700/286 |
| 2013/0275665 A1* | 10/2013 | Saraswat | .................. | G11C 7/04 711/106 |
| 2013/0295697 A1* | 11/2013 | Hanan | ................ | G01R 31/2884 438/12 |

(Continued)

*Primary Examiner* — Adam M Queler
*Assistant Examiner* — Alex G Olson

(57) ABSTRACT

The present disclosure describes apparatuses and techniques that enable temperature-based memory access. In some aspects, a request to access a memory device is received. In response to the request, respective temperatures are determined for multiple locations of the memory device. Based on these respective temperatures, a selection can be made of which of the multiple locations to access. Alternately or additionally, an order in which to access the multiple locations can be determined based on the respective temperatures. The location(s) of the memory device are then accessed based on the selection or the determined order effective to minimize an increase in the memory device's temperature.

20 Claims, 10 Drawing Sheets

(56) References Cited

U.S. PATENT DOCUMENTS

| | | | |
|---|---|---|---|
| 2014/0281311 A1* | 9/2014 | Walker | G06F 3/0631 711/162 |
| 2015/0006787 A1* | 1/2015 | Liu | G06F 3/0604 711/103 |
| 2015/0006788 A1* | 1/2015 | Liu | G06F 3/0685 711/103 |

* cited by examiner

500

|   | X → | | | | | | | |
|---|---|---|---|---|---|---|---|---|
| | 0 | 1 | 2 | 3 | 4 | 5 | 6 | 7 |
| Y 0 | 1 | 0 | 0 | 0 | 0 | 0 | 0 | 0 |
| ↓ 1 | 1 | 1 | 0 | 0 | 0 | 0 | 0 | 0 |
| 2 | 2 | 1 | 1 | 1 | 1 | 1 | 1 | 0 |
| 3 | 3 | 2 | 1 | 2 | 1 | 2 | 1 | 1 |
| 4 | 2 | 2 | 2 | 3 | 2 | 1 | 0 | 0 |
| 5 | 3 | 2 | 1 | 2 | 1 | 1 | 0 | 0 |
| 6 | 2 | 1 | 1 | 1 | 1 | 2 | 1 | 0 |
| 7 | 1 | 0 | 0 | 1 | 2 | 3 | 2 | 1 |

502

|   | X → | | | | | | | |
|---|---|---|---|---|---|---|---|---|
| | 0 | 1 | 2 | 3 | 4 | 5 | 6 | 7 |
| Y 0 | 1 | 0 | 1 | 2 | 2 | 3 | 2 | 1 |
| ↓ 1 | 1 | 1 | 2 | 3 | 2 | 2 | 1 | 0 |
| 2 | 2 | 1 | 1 | 2 | 1 | 1 | 0 | 0 |
| 3 | 2 | 2 | 1 | 1 | 1 | 1 | 1 | 0 |
| 4 | 2 | 1 | 1 | 2 | 2 | 1 | 0 | 0 |
| 5 | 2 | 2 | 1 | 1 | 2 | 1 | 1 | 0 |
| 6 | 2 | 1 | 1 | 1 | 2 | 1 | 1 | 1 |
| 7 | 1 | 1 | 0 | 1 | 1 | 2 | 1 | 1 |

|   | X → | | | | | | | |
|---|---|---|---|---|---|---|---|---|
| Y ↓ | 0 | 1 | 2 | 3 | 4 | 5 | 6 | 7 |
| 0 | 1 | 0 | 0 | 0 | 0 | 0 | 0 | 0 |
| 1 | 1 | 1 | 0 | 0 | 0 | 0 | 0 | 0 |
| 2 | 2 | 1 | 1 | 1 | 1 | (1) | 1 | 0 |
| 3 | (3) | 2 | 1 | (2) | 1 | 2 | 1 | 1 |
| 4 | 2 | 2 | 2 | 3 | 2 | 1 | (0) | 0 |
| 5 | (3) | 2 | 1 | 2 | 1 | 1 | 0 | 0 |
| 6 | 2 | 1 | 1 | 1 | 1 | 2 | 1 | (0) |
| 7 | 1 | 0 | (0) | 1 | 2 | 3 | 2 | 1 |

902

|   | X → | | | | | | | |
|---|---|---|---|---|---|---|---|---|
| Y ↓ | 0 | 1 | 2 | 3 | 4 | 5 | 6 | 7 |
| 0 | 00 | 15 | 16 | 31 | 32 | 47 | 48 | 63 |
| 1 | 01 | 14 | 17 | 30 | 33 | 46 | 49 | 62 |
| 2 | 02 | 13 | 18 | 29 | 34 | (45) | 50 | 61 |
| 3 | (03) | 12 | 19 | (28) | 35 | 44 | 51 | 60 |
| 4 | 04 | 11 | 20 | 27 | 36 | 43 | (52) | 59 |
| 5 | (05) | 10 | 21 | 26 | 37 | 42 | 53 | 58 |
| 6 | 06 | 09 | 22 | 25 | 38 | 41 | 54 | (57) |
| 7 | 07 | 08 | (23) | 24 | 39 | 40 | 55 | 56 |

Fig. 9

TEMPERATURE-BASED MEMORY ACCESS

RELATED APPLICATIONS

This present disclosure claims priority to U.S. Provisional Patent Application Ser. No. 61/952,085 filed Mar. 12, 2014, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

To accommodate user's ever-increasing expectations for computing performance, many memories technologies are moving to three-dimensional (3D) geometries to increase memory density. By stacking layers of memory cells, these 3D geometries and memory structures enable the storage of more data in comparison to traditional planar or two-dimensional (2D) memory structures. The stacked layers of memory cells, however, often prevent heat generated by memory access operations from quickly conducting or radiating out of a memory, thereby trapping the heat within the memory. Increases of the memory's temperature caused by this trapped heat often effect the electrical characteristics of the memory device (e.g., cell voltages), which compromises the memory's reliability.

SUMMARY

This summary is provided to introduce subject matter that is further described below in the Detailed Description and Drawings. Accordingly, this Summary should not be considered to describe essential features nor used to limit the scope of the claimed subject matter.

A method is described for receiving a request to access a memory device. In response to receiving the request, respective temperatures of a first location and a second location of the memory device are determined. Which of the two locations to access is selected based on the respective temperatures effective to minimize an increase in the memory device's temperature. The selected location of the memory device is then accessed to complete the request.

Another method is described for receiving multiple requests to access a memory device. In response to receiving the multiple requests, respective temperatures of multiple locations of the memory device are determined. An order in which to access the multiple locations is determined based on the respective temperatures effective to minimize an increase in the memory device's temperature. The multiple locations are then accessed in the determined order to complete the multiple requests.

A System-on-Chip is described that includes a memory interface, host interface, computer-readable media configured to maintain a heat map, and a memory access manager. The memory access manager is configured to receive, via the host interface, a request to access a memory device. In response to the request, the memory access manager accesses the heat map to determine respective temperatures of at least two of the memory device's locations. Based on the respective temperatures, the memory access manager selects one of the at least two locations to access effective to minimize an increase in the memory device's temperature. The selected location is then accessed via the memory interface to complete the request.

The details of one or more implementations are set forth in the accompanying drawings and the description below. Other features and advantages will be apparent from the description and drawings, and from the claims.

BRIEF DESCRIPTION OF THE DRAWINGS

The details of one or more implementations are set forth in the accompanying figures and the detailed description below. In the figures, the left-most digit of a reference number identifies the figure in which the reference number first appears. The use of the same reference numbers in different instances in the description and the figures indicate like elements.

FIG. 5 illustrates example implementations of heat maps in accordance with one or more aspects.

FIG. 7 illustrates examples of an occupation map and heat map in accordance with one or more aspects.

FIG. 9 illustrates an example of sequencing of data read operations for accessing locations of a memory device.

DETAILED DESCRIPTION

Memory structures and circuits often trap or retain heat generated by access operations or other circuit-based activities. This heat increases temperatures within the memory, which impairs various aspects of the memory's performance, such as reliability. For example, when voltages of memory cells are altered by increased temperatures, the data written to, or read from, these memory cells becomes less reliable. In most cases, high temperatures are a leading cause or contributing factor of memory reliability issues.

This disclosure describes apparatuses and techniques for temperature-based memory access. In at least some aspects, respective temperatures of memory locations are determined prior to accessing the memory. Which of the locations to access is determined based on the respective temperatures effective to minimize an increase in the memory device's temperature. Alternately or additionally, an order in which to access the locations is determined based on the respective temperatures effective to minimize an increase in the memory device's temperature. By so doing, temperatures of the memory device can be managed below or within a particular range to improve a reliability of the memory device. Although described with reference to memory devices, aspects described herein may also be applied to other two-dimensional (2D) or three-dimensional (3D) devices or circuits, such as processors, field-programmable gate arrays (FPGAs), display/lighting arrays (e.g., organic light-emitting diode (OLED) arrays), storage media (e.g., magnetic or optical), and the like.

The following discussion describes an operating environment, techniques that may be employed in the operating environment, and a System-on-Chip (SoC) in which components of the operating environment can be embodied. In the discussion below, reference is made to the operating environment by way of example only.

Operating Environment

Figure 1:
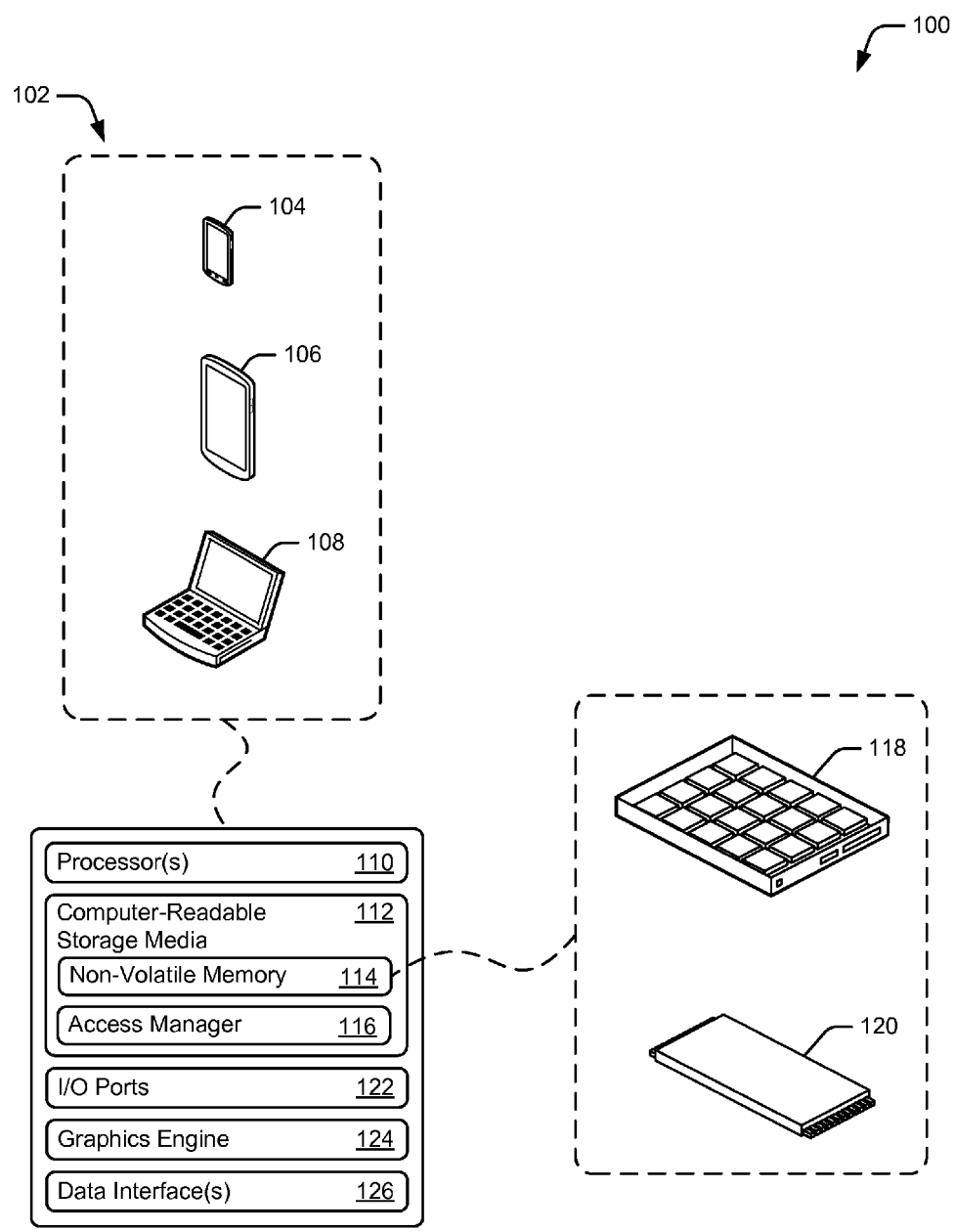
FIG. 1 illustrates an operating environment having computing devices in accordance with one or more aspects.

FIG. 1 illustrates an example operating environment 100 having a computing device 102, which is capable of storing or accessing various forms of data. Examples of a computing device 102 include smart phone 104, tablet computer 106, and laptop computer 108. Further examples of computing device 102 include a desktop computer, a smart phone, a set-top-box, an embedded communication device, a data storage appliance (e.g., network-attached storage), and so on. Computing device 102 may store or communicate data for any suitable purpose, such as to enable functionalities of a particular type of device, provide a user interface, enable network access, implement gaming applications, playback media, edit content, and the like.

Computing device 102 includes processor(s) 110 and computer-readable storage media 112. Processor(s) 110 can be any suitable type of processor, either single-core or multi-core, for executing instructions or commands of an operating system or application of computing device 102. Computer-readable media 112 (CRM 112) includes volatile memory (not shown), non-volatile memory 114, and memory access manager 116 (access manager 116). The volatile memory of computing device 102 may include various types of random-access memory (RAM), dynamic RAM (DRAM), and the like. Non-volatile memory 114 may include any suitable type of non-volatile memory, such as read-only memory (ROM), electronically erasable programmable ROM (EEPROM) or Flash memory. These memories, individually or in combination, may store data associated with applications and/or an operating system of computing device 102. Generally, access manager 116 manages access of computing device 102's computer-readable media. How access manager 116 is implemented and used varies and is described below.

In this particular example, non-volatile memory 114 includes solid-state drive 118 (SSD 118) and Flash memory integrated-circuit (IC) chip 120 (Flash chip 120). SSD 118 and Flash chip 120 may be implemented using any suitable type of non-volatile memory technology such as NOR Flash or NAND Flash. In some cases, SSD 118 or Flash chip 120 store data associated with an operating system or applications of computing device 102. In such cases, the operating system or applications may issue access requests to write or read data from SSD 118 or Flash chip 120 to implement operations of computing device 102.

Computing devices 102 may also each include I/O ports 122, graphics engine 124, and data interface 126. I/O ports 122 allow a computing device 102 to interact with other devices and/or users. Graphics engine 124 processes and renders graphics for computing device 102, including user interface elements of an operating system, applications, and the like. In some cases, graphics engine 124 accesses CRM 112 to render graphics or includes a dedicated volatile memory for rendering graphics (e.g., video RAM).

Data interface(s) 126 provide connectivity to one or more networks and other devices connected therewith. Data interfaces 126 may include wired interfaces, such as Ethernet or fiber optic interfaces for communicated over a local network, intranet, or the Internet. Data interfaces 126 may also include wireless interfaces that facilitate communication over wireless networks, such as wireless LANs, cellular networks, and/or wireless personal-area-networks (WPANs).

Figure 2:
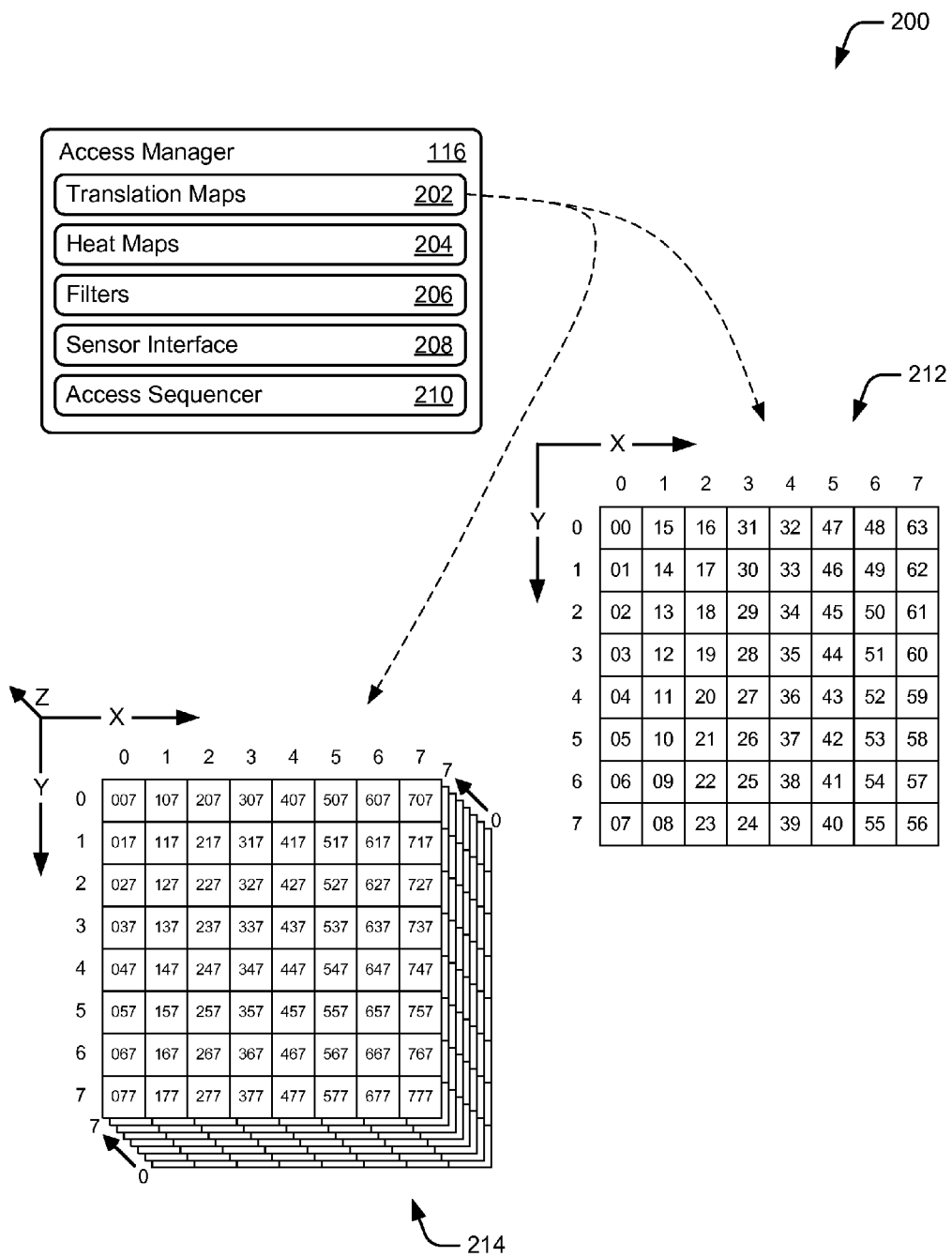
FIG. 2 illustrates an example configuration of the memory access manager shown in FIG. 1.

FIG. 2 illustrates an example implementation of access manager 116, which is capable managing access to computer-readable media of computing device 102, such as SSD 118 or Flash chip 120. In this particular example, access manager 116 includes logical-to-physical translation maps 202, heat maps 204, filters 206, sensor interface 208, and access sequencer 210. Logical-to-physical translation maps 202 (translation maps 202) enable mapping of logical memory addresses, which are used by other entities of computing device 102 to access CRM 112, to physical locations of a memory device. Alternately, translation maps 202 may enable mapping of physical locations (e.g. physical addresses) of the memory to logical addresses. In some cases, translation maps 202 are implemented as, or in conjunction with, an address translation layer of a memory controller associated with the memory device. In such cases, the mapping of logical addresses to physical locations (or physical addresses) may be dynamic and configurable when accessing CRM 112.

Translation maps 202 may be implemented using any suitable resolution or number of dimensions. In some cases, a resolution of a translation map is determined by logical addresses grouping or the way in which the logical address are grouped. Alternately or additionally, the way in which the logical addresses are grouped may determine the dimensions of the translation map. For example, a translation map for a memory device may be one-dimensional for grouping logical addresses on a per-block basis, two-dimensional for grouping logical addresses on a per-page basis, or three-dimensional for grouping logical addresses on a per-cell basis.

As another example, consider translation map 212 as shown in FIG. 2, which is implemented for logical addresses grouped on a page-by-page basis. In the context of translation map 212, logical addresses for each page of a memory device are mapped to a location of translation map 212 that represents a physical page of the memory device. In other words, the locations of translation map 212 represent physical locations of a memory device that are accessible by the mapped logical addresses. As such, the logical addresses of translation maps 202 may not be fixed or have direct correlation (e.g., matching address) with an actual physical location within a memory device. Here, the logical addresses of translation map 212 are assigned sequentially starting with logical page address 00 (e.g., page 0 of block 0) at location 0,0 (in the X,Y (block,page) coordinate system shown in FIG. 2, and ending at logical page address 63 (e.g., page 7 of block 7) at location 7,0. Alternately or additionally, the mapping of logical addresses to the locations of a translation map may be scattered, random, or dynamic (e.g., per write/read cycle).

Next consider translation map 214, which illustrates an increased resolution of mapping associated with logical addresses that are grouped on a cell-by-cell basis. In the context of translation map 214, a logical address of each cell is mapped to a location of translation map 214 that represents a physical location of the memory cell. In other words, the locations of translation map 214 represent physical locations of memory cells that are accessible by the mapped logical addresses. Here, the logical addresses for cells of the memory device are assigned based on the shown coordinate system with cell address 000 (e.g., cell 7 of page 0 of block 0) at location (0,0,7) and ending at cell address 777 (e.g., cell 7 of page 7 of block 7) at location (7,7,7). Alternately or additionally, the mapping of logical addresses to the locations of a translation map may be sequential (e.g., 000 to 511), scattered, random, or dynamically updated. These are but a few examples of ways in which translation maps 202 can be implemented.

Access manager 116 also includes heat maps 204, which may be provided based on translation maps 202. Generally, heat maps 204 maintain temperature information for physical locations of a memory device. How heat maps 204 are implemented and used vary and is described below. Filters 206 may be applied to heat maps 204 to estimate or predict the dissipation of heat between physical locations of a memory device. In some cases, geometries or resolutions of filters 206 are configured to match those of a particular heat map to which the filters are applied (e.g., 2D or 3D). Alternately or additionally, filters 206 may be configured based on an optical function, such as a blurring, Gaussian, smoothing, or saturation function.

Sensor interface 208 enables access manager 116 to receive information from temperature sensors associated with CRM 112 or memory devices thereof. For example, a memory device (e.g., chip or multi-chip module) may include temperature sensors configured to provide information on a per-device, per-block, or per-page resolution. Access sequencer 210 is configured to monitor a queue of memory access requests or memory access commands (e.g., read, write, or erase). Access sequencer 210 may also enable access manager 116 to manage a sequence or order in which the memory access requests or commands are performed, such as by altering their respective positions in the queue.

Techniques of Temperature-Aware Memory Access

The following discussion describes techniques of temperature-aware memory access. These techniques can be implemented using the previously described environments and entities, such as access manager 116, translation maps 202, heat maps 204, filters 206, and access sequencer 210. These techniques include methods illustrated in FIGS. 3, 4, 6, and 8, each of which is shown as a set of operations performed by one or more entities. These methods are not necessarily limited to the orders shown for performing the operations. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 by way of example. Such reference is not to be taken as limited to operating environment 100 but rather as illustrative of one of a variety of examples.

Figure 3:
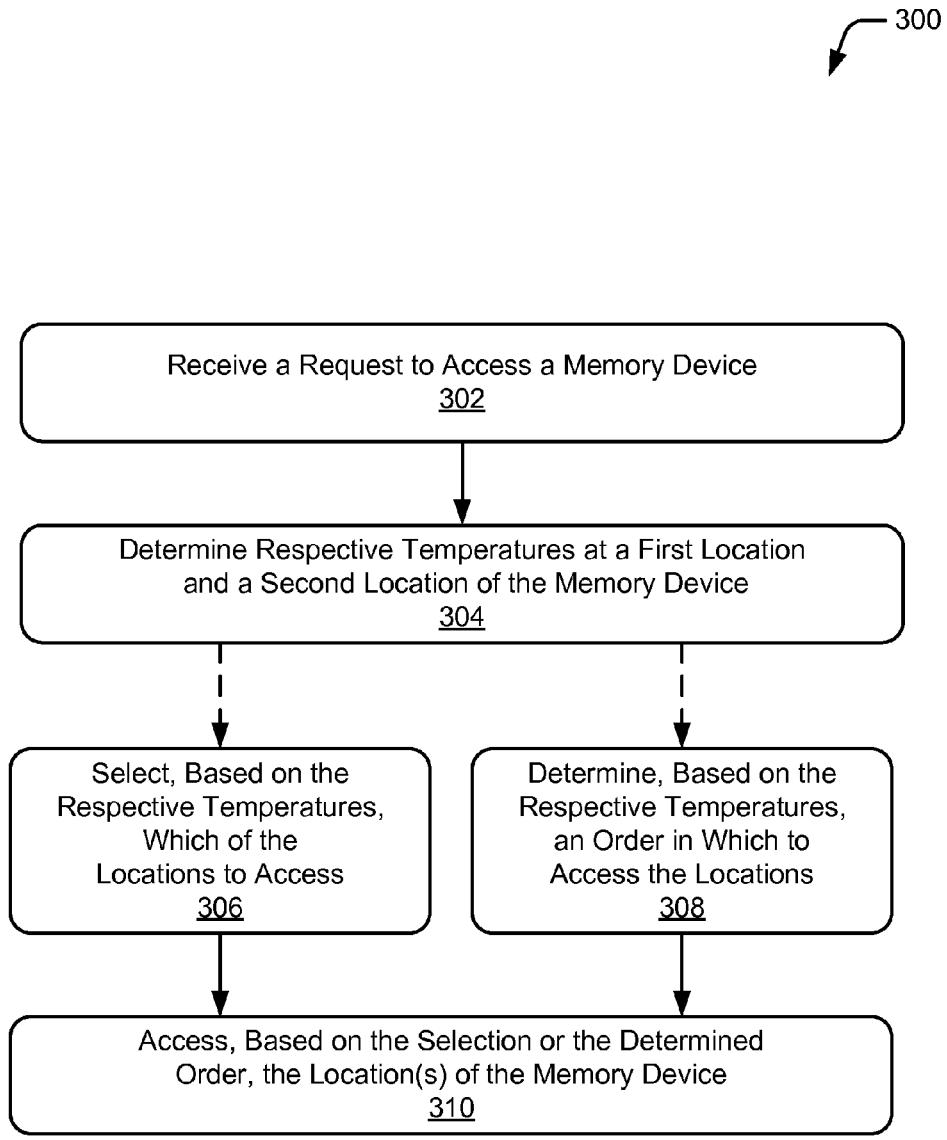
FIG. 3 illustrates example methods for temperature-based memory access in accordance with one or more aspects.

FIG. 3 depicts methods 300 for temperature-based memory access, including operations performed by access manager 116 of FIG. 1.

At 302, a request to access a memory device is received. The request may be a request to write data to or program a logical address of the memory device. Alternately, the request may be a request to read data from a logical address of the memory device. The request may have any suitable resolution, such as to access one or more blocks, pages, or cells of the memory device.

At 304, respective temperatures of a first location and a second location of the memory device are determined. The first and second location may be any physical location of the memory device, and may be two of many locations for which respective temperatures are determined. In some cases, the respective temperatures are determined by accessing information received from thermal or temperature sensors associated with the memory device. Alternately or additionally, the respective temperatures are determined by accessing a heat map of the memory device, such as described with respect to method 400 below.

Optionally at 306, which of the two locations to access is selected based on the respective temperatures. In some cases, access of the memory device is not dependent on a particular physical location, such as when writing or programming logical addresses of the memory device. In such cases, a location can be selected such that an increase in the memory device's temperature associated accessing that location is minimized. For example, when writing data to the memory device, a cooler of the two locations can be selected such that the data write operation increases the temperature of the cooler location, instead of a hotter location. By so doing, the memory device's temperature can be managed to minimize the heat's effects on electrical properties of the memory cells, thereby improving reliability of the memory device.

Optionally at 308, an order in which to access the two locations is determined based on the respective temperatures. In some cases, access of the memory device is dependent on a particular physical location, such as when reading data from a logical address of the memory device. In such cases, the data to be read is stored at a physical location that may be mapped to the logical device. In other words, to read the requested data, a particular physical location is accessed to extract the data. Although this may effectively preclude the selection of a physical location for access, timing of the access may still be altered based on temperatures of the physical locations.

For example, multiple requests to access the memory device may include one or more requests to read data from the memory device. Based on respective temperatures of the locations storing the data to be read, performance of the one or more read requests may be delayed effective to allow the locations storing the data to cool. By so doing, the memory device's temperature can be managed to minimize the heat's effects on electrical properties of the memory cells, thereby improving reliability of the memory device.

At 310, the location of the memory device is accessed based on the selection or in the determined order. In some cases, such as for requests to write or program the memory device, the logical address associated with the request is mapped to the selected location to facilitate completion of the request. In other cases, such as for requests to read data from the memory device, performance of the access is delayed or re-ordered in a queue effective to access the location based on the determined order. By so doing, access of the memory device is managed such that a temperature of the memory device is minimized.

Figure 4:
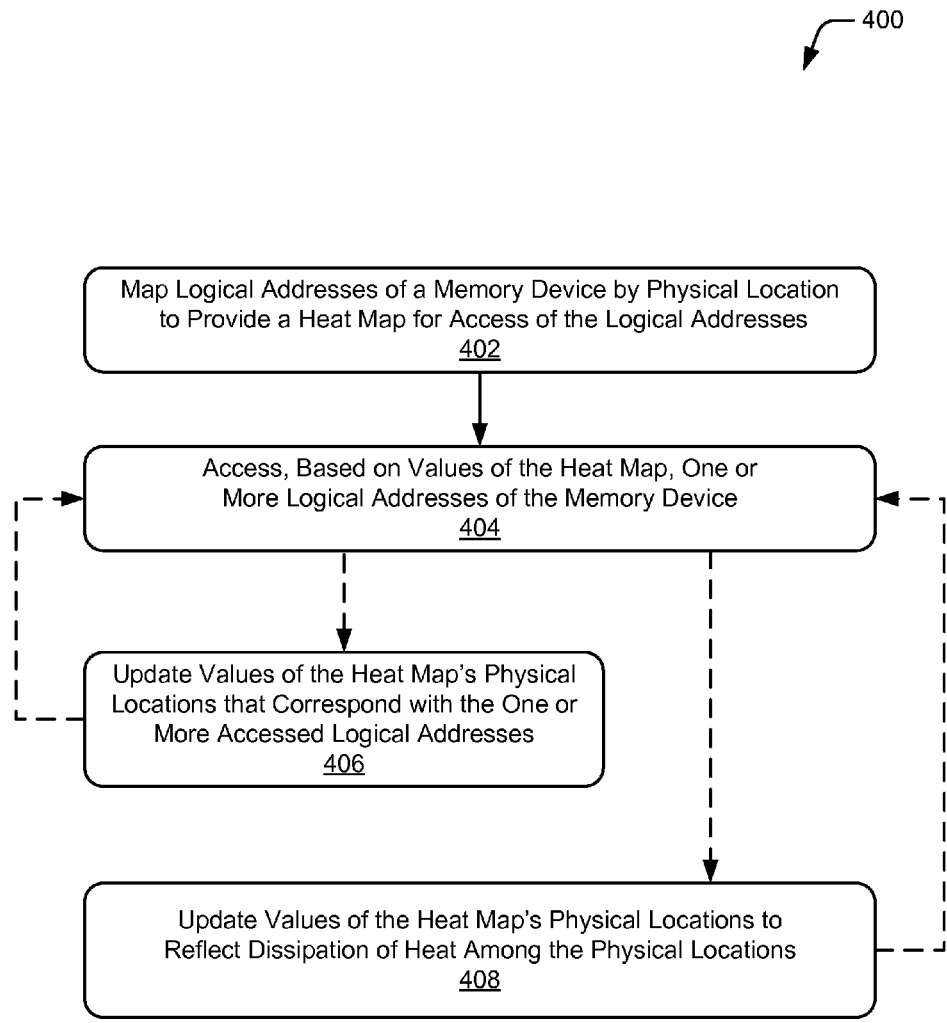
FIG. 4 illustrates example methods of providing and/or maintaining a heat map for memory or other circuits.

FIG. 4 depicts a method 400 for providing and/or maintaining a heat map, including operations performed by access manager 116 of FIG. 1.

At 402, logical addresses of a memory device are mapped by physical location to provide a heat map of the memory device. This can be effective to provide a map of heat values for the physical locations of the memory device. In some cases, an address translation layer is used to map the logical address back to a corresponding physical location or physical address. Alternately or additionally, a logical-to-physical translation map, such as those described with reference to FIG. 2, may be used to provide a heat map for a memory device.

Each location of the heat map may include temperature information for a corresponding physical location of the memory device. As noted with respect to the translation maps, the dimensions or resolution of a heat map may be determined by logical address grouping. Accordingly, the temperature information of a particular location of a heat map can indicate a temperature of a physical block, physical page, or physical cell of memory. In some cases, the temperature information indicates an absolute temperature of the physical location, such as a temperature in Kelvin or Celsius. In other cases, the temperature information indicates a temperature relative to other physical locations, such as a scaled temperature range of zero to three, zero to five, zero to seven, or zero to 15, which may be convenient for binary representation.

By way example, consider a NAND memory module of SSD 118 that includes 8 blocks of NAND memory. Here, assume that each block of the NAND memory includes 8 pages, and that each page further includes 8 cells of NAND Flash. By using translation map 212, which provides a suitable page-by-page resolution, the logical addresses of the NAND memory module can be mapped to provide heat map 500 of FIG. 5. With reference to heat map 500, relative temperatures of each physical location are mapped over a corresponding logical address, such as those of translation map 212. For example, the temperature values of heat map 500 range from zero to three, with zero indicating the lowest temperature and three indicating the highest. As indicated by translation map 212 and heat map 500, the logical addresses of 03 (0,3), 05 (0,5), 27 (3,4), and 40 (5,7) are mapped to the locations of the NAND memory module with the highest temperatures.

At 404, one or more of the logical addresses are accessed based on values of the heat map. In some cases, the logical addresses are accessed in response to receiving a request from a host attempting to access the memory device. The access of the memory device may include operations to write data, read data, or erase data of the memory device. Alternately or additionally, access of the memory device may be performed with reference to operations of methods 600 or 800, which are described below. By using the values of the heat map, the access of the memory device can be directed to cooler physical locations of the memory device. Alternately or additionally, particular operations to access physical locations may be delayed effective to permit those physical locations to cool prior to the access. By so doing, the temperature of the memory device can be managed to improve performance or reliability of the memory device.

In the context of the current example, assume that laptop computer 108 requests to write data to two pages of SSD 118. Here, assume that the write data requests is targeted to logical addresses 08 and 09. In response to the request, access manager 116 searches heat map 500 for locations that have low temperatures. In some cases, access manager 116 may also determine which locations of the memory device are available for particular types of operations, such as write operations. Based on the values of heat map 500, access manager selects locations (3,1) and (5,0) for the data write request of laptop computer 108. To facilitate completion of the access, access manager 116 maps locations (3,1) and (5,0) to logical addresses 08 and 09 using an address translation layer.

From operation 404, method 400 may proceed to operation 406 or to operation 408 to update the values of the heat map. Optionally at 406, values of the heat map that correspond to the accessed logical addresses are updated. This is effective to reflect heat generated by the access of the locations. In some cases, an amount by which the heat value is altered depends on the type of access operation performed. For example, read operations are often performed with a low amount of voltage, and therefore contribute the least amount of heat to the accessed location. Write operations may be performed with increased amounts of voltage and may contribute more heat than a read operation. Further, erase operations, which are often performed using more voltage and multiple logical addresses, may generate even more heat in the memory device's locations. Once the heat values are updated, method 400 may return to operation 404 to perform additional accesses of the memory device.

Continuing the ongoing example, two values of heat map 500 are updated as shown by heat map 502 to reflect the heat introduced by writing data to the locations of (3,1) and (5,0). Here, access manager 116 increases each of the respective values from a base value of zero to three in order to reflect the heat generated by the data write operation. In other cases, such as reading or erasing locations, the values may be increased by two or four increments, respectively, to reflect the various amounts of heat generated by the different types of memory access.

Optionally at 408, values of the heat map are updated to reflect dissipation of heat among the physical locations of the memory device. This can be effective to estimate or predict the conduction or radiation of heat from the memory device. For example, in the case of 3D heat maps, values of the heat map are updated to reflect the conduction of heat to the surfaces of the memory device, from which it is then radiated or carried away by convection.

In some aspects, a filter is applied to the heat map to simulate the spread of heat throughout the locations of the memory device. The filter may implement a mathematical or optical function, such as a Gaussian, blurring, smoothing, or spreading function. For example, an optical blur function applied to the heat map can approximate the spread of heat to neighboring locations. Alternately or additionally, the filter includes a timing parameter based on a duration of time between memory accesses or be applied periodically to update the values of the heat map continually. Once the heat values are updated, method 400 may return to operation 404 to perform additional accesses of the memory device.

Concluding the present example, access manager 116 applies a 2D blur filter to heat map 500 to update the heat values as shown by heat map 502. The application of the 2D blur filter spreads the existing values of heat map 500, as well as the newly introduced heat associated with the data write operations at (3,1) and (5,0). As shown by FIG. 5, the 2D filter spreads heat from the hottest locations of the memory device toward the cooler locations. By updating values of the heat map to reflect dissipation of the heat, subsequent memory access can be directed to cooler locations of the memory.

Figure 6:
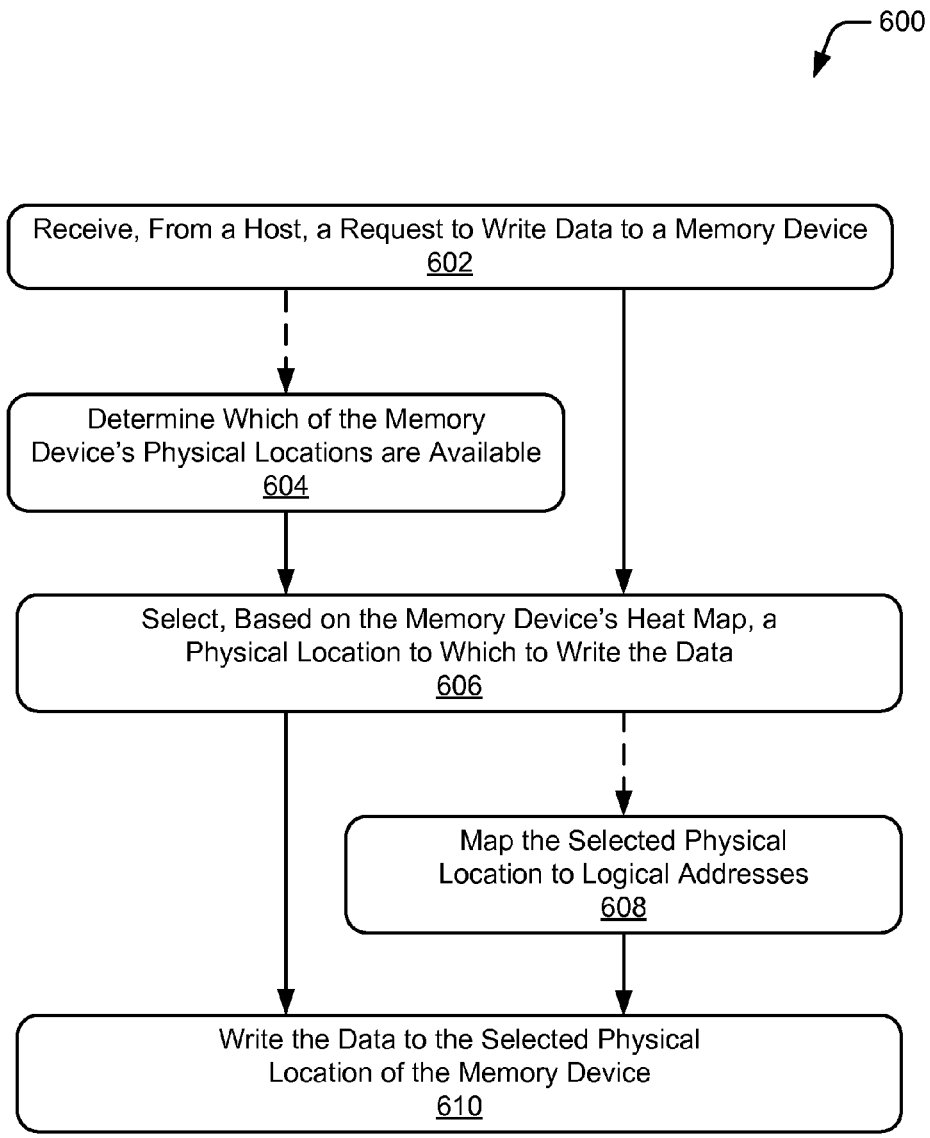
FIG. 6 illustrates an example method for writing or programming a memory based on memory location temperature.

FIG. 6 depicts a method 600 for writing or programming a memory based on memory location temperature, including operations performed by access manager 116 of FIG. 1.

At 602, a request to write data to a memory device is received from a host. The request may specify a particular logical address to program with data or erase. In the case of erasure, the logical address may specify an entire page or block of memory cells to erase. By way of example, assume that a request from host device includes two pages of data to be written to a memory device.

Figure 7:
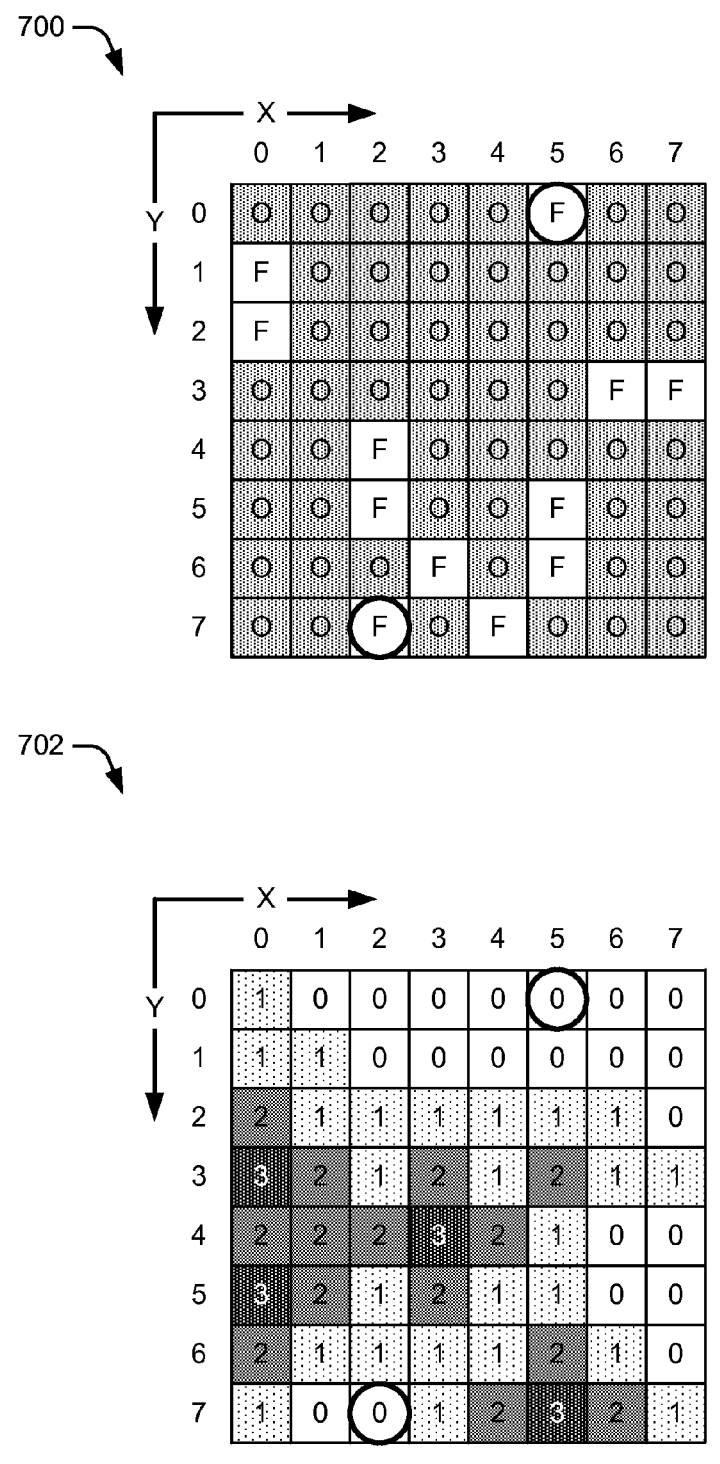

Optionally at 604, a determination is made as to which physical locations of the memory are available. For example, some types of memory may not support write operations to memory locations that are occupied or unavailable. As such, operation 604 may determine which locations of the memory device are available for programming. In the context of the present example, consider occupation map 700 of FIG. 7, which indicates free pages of the memory device.

At 606, a physical location to which to write the data is selected based on a heat map of the memory device. Accessing the heat map enables respective temperatures to be determined for the locations of the memory device. In some cases, the heat map is scanned until a location of sufficiently low temperature is found. In other cases, the entire heat map is scanned to select an area of the memory device such that access of the area minimizes temperature increases of the memory. By selecting the location based on the heat map, increases in the memory device's temperature can be minimized. Continuing the ongoing example, access manager 116 scans heat map 702 of FIG. 7 to find locations of the memory device that have low temperatures. Access manager 116 then selects, based on occupation map 700 and heat map 702, locations (2,7) and (5,0) as target locations for the two pages of data.

Optionally at 608, the selected physical address is mapped to the logical address. In some cases, the request is made via a logical address from the perspective of the host. In such cases, the logical address can be mapped to the selected location (or physical address) to facilitate the writing of data to the memory device. By so doing, the host device can access the data stored at the location by referencing the mapped logical address. In the context of the present example, access manager 116 uses an address translation layer to map logical addresses of the requests to the selected locations at which the data is written.

At 610, the data is written to the selected location of the memory device to complete the request. In some cases, separate data writing operations may be delayed effective to permit adjacent or other locations of the memory device to cool between the separate operations. Alternately or additionally, the access operations to write the data may be advanced in a queue such that other access operations to read data are delayed. Concluding the present example, the two pages of host data are written to the target locations (2,7) and (5,0) to complete the host's request. After the write operations, access manager 116 may update heat map 702 to reflect the heat introduced by writing the data to the target locations. Access manager 116 may also update the values of heat map 702 to reflect the dissipation of heat among the physical locations of the memory device.

Figure 8:
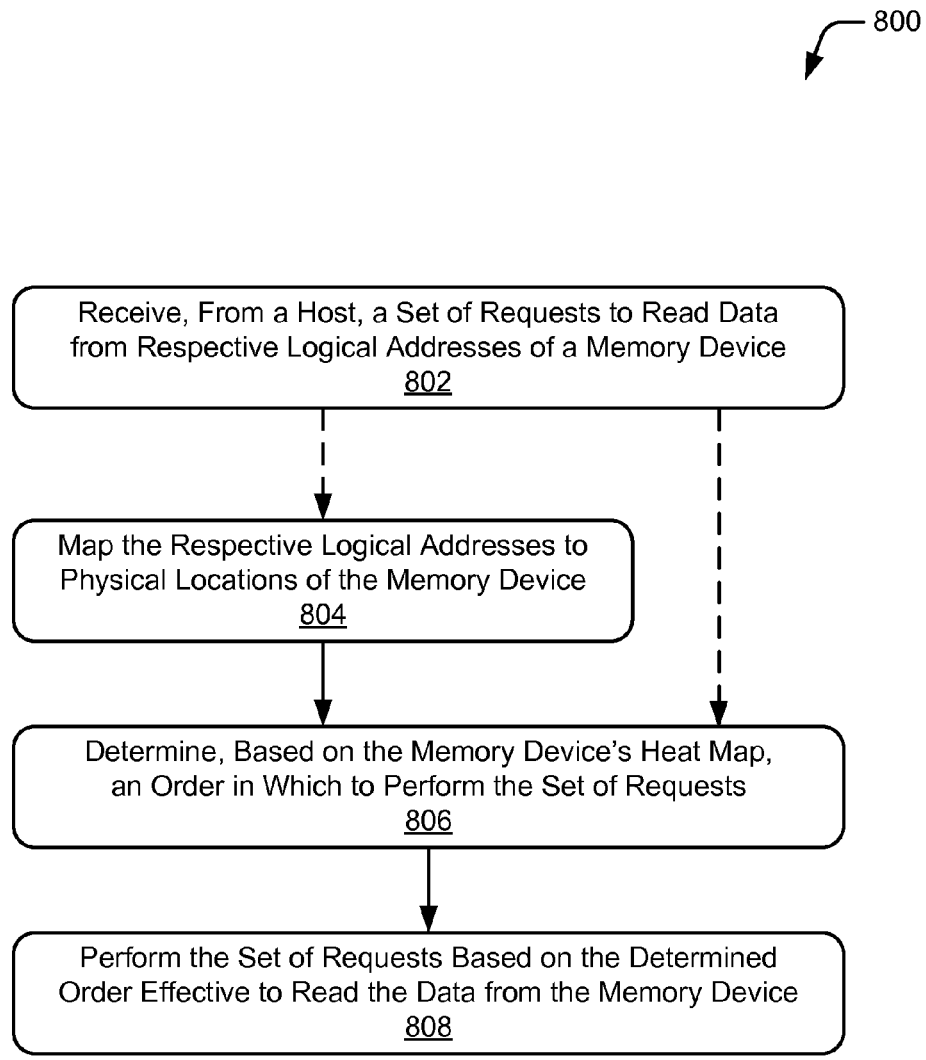
FIG. 8 illustrates an example method for reading data from a memory device based on memory location temperature.

FIG. 8 depicts a method 800 for reading data from a memory device based on memory location temperature, including operations performed by access manager 116 of FIG. 1.

At 802, a set of requests to read data from a memory device are received. The set of requests may be received in or specify a particular sequence in which to read data from the memory device. In some cases, the requests each include a logical address indicating a location from which to read the data. The requests specify the access of data at any suitable resolution, such as a request to read a particular page or cell of the data. By way of example, consider a host issuing a set of commands to read data from seven pages of a Flash chip 120. Each of the seven requests may reference a memory location using a logical address, such as 03, 05, 23, 28, 45, 52, and 57.

Optionally at 804, respective logical addresses of the requests are mapped to physical locations of the memory device. For cases in which the requests are made via logical address, mapping the respective logical addresses to the physical locations may facilitate the operations to read the data. In the context of the present example, a logical-to-physical translation layer is used to map the logical addresses to their respective physical locations.

At 806, an order in which to perform the set of requests is determined based on a heat map of the device. Accessing the heat map enables respective temperatures to be determined for the physical locations of the memory device. When reading data from a memory device, a temperature for each target location may be determined. From this temperature information, an order may be determined such that data is read from cooler locations first. By so doing, increases in the memory device's temperature associated with the read operations can be minimized.

Continuing the ongoing example, heat map 900 of FIG. 9 is accessed to determine the respective temperatures of location from which the data is to be read. Here, logical addressed 03, 05, 23, 28, 45, 52, and 57 are mapped locations (0,3), (0,5), (2,7), (3,3), (5,2), (6,4) (7,6) of heat map 900. An order is then determined in which the data is read from the cooler locations before those locations of higher temperature, effective to minimize temperature increases of Flash chip 120. The determined order is illustrated by translation map 902, starting with logical address 23, one of the coolest locations, and ending with logical address 05, one of the hottest locations.

At 808, the set of requests are performed based on the determined order effective to read the data from the memory device. The set of requests may be performed in sequence or directly in the determined order. In some cases, other types of requests may be interspersed among the read requests. Alternately or additionally, the read requests may be delayed to allow a target location to cool before being accessed. This may also be effective to permit other types of requests to be performed, such as a write request to another area of the memory device. Concluding the present example, the locations of the memory device, which correspond to the logical addresses of the request, are accessed to read the data from Flash chip 120.

System-On-Chip

Figure 10:
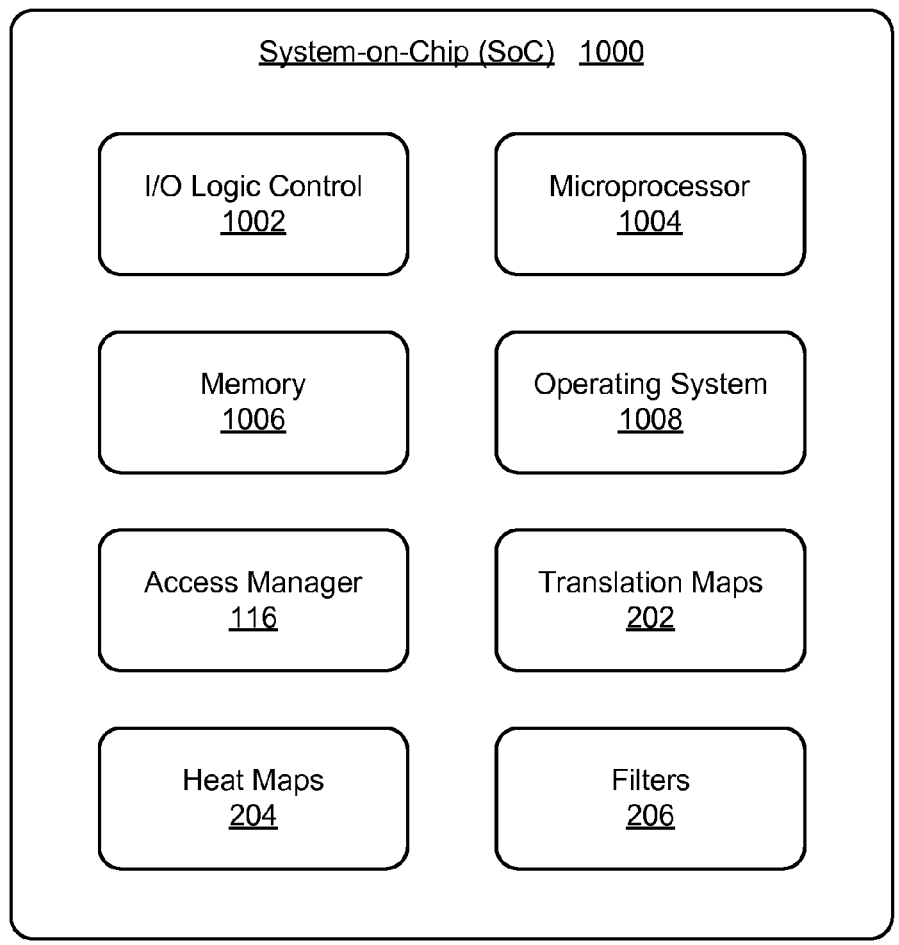
FIG. 10 illustrates a System-on-Chip (SoC) environment for implementing aspects of temperature-based memory access.

FIG. 10 illustrates a System-on-Chip (SoC) 1000, which can implement various embodiments of temperature-based memory access. An SoC can be implemented in any suitable device, such as a smart-phone, cellular phone, video game console, IP enabled television, desktop computer, laptop computer, tablet computer, server, base station, wireless router, smart appliance, network-enabled printer, set-top box, printer, scanner, camera, picture frame, and/or any other type of device that may implement memory or other 3D circuitry.

SoC 1000 can be integrated with electronic circuitry, a microprocessor, memory, input-output (I/O) logic control, communication interfaces and components, other hardware, firmware, and/or software needed to provide communicative coupling for a device, such as any of the above-listed devices or as an application specific integrated circuit (ASIC) for integration within any of the above-listed devices. SoC 1000 can also include an integrated data bus (not shown) that couples the various components of the SoC for data communication between the components. In some cases, these various components may be configured to implement concepts described herein over a general purpose bus, internal memory bus, memory controller link, or external memory bus.

In this example, SoC 1000 includes various components such as an input-output (I/O) logic control 1002 (e.g., to include electronic circuitry) and a microprocessor 1004 (e.g., any of a microcontroller, application processor, or digital signal processor). SoC 1000 also includes a memory 1006, which can be any type of RAM, nonvolatile memory (e.g., NAND Flash), ROM, and/or other suitable electronic data storage. SoC 1000 can also include various firmware and/or software, such as an operating system 1008, which can be computer-executable instructions maintained by memory 1006 and executed by microprocessor 1004. SoC 1000 can also include other various communication interfaces and components, communication components, other hardware, firmware, and/or software.

SoC 1000 includes access manager 116, translation maps 202, heat maps 204, and filters 206, which may be embodied as disparate or combined components, as described in relation to various aspects presented herein. Examples of these various components, functions, and/or entities, and their corresponding functionality, are described with reference to the respective components of the environment 100 shown in FIGS. 1 and 2. Access manager 116, either independently or in combination with other entities (e.g., SSD 118, Flash chip 120, or controller therefore), can be implemented as computer-executable instructions maintained by memory 1006 and executed by microprocessor 1004 to implement various embodiments and/or features described herein.

Access manager 116, either independently or in combination with other entities, can be implemented with any suitable combination of components to implement various embodiments and/or features described herein. Access manager 116 may also be provided integral with other entities of the SoC, such as integrated with memory 1006, a controller of memory 1006, or any other signal processing or conditioning section within SoC 1000. Alternately or additionally, access manager 116 and the other components can be implemented as hardware, firmware, fixed logic circuitry, or any combination thereof that is implemented in connection with the I/O logic control 1002 and/or other signal processing and control circuits of SoC 1000.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A method comprising:
   receiving a request to access a memory device, a type of the request being one of (i) a read request, (ii) a write request, or (iii) an erase request;
   determining the type of the request to access the memory device as one of (i) the read request, (ii) the write request, or (iii) the erase request;
   accessing, in response to the request, a map of temperature values for locations of the memory device to determine respective temperature values of a first location and a second location of the memory device;
   selecting, based on the respective temperature values of the first and second locations, which of the two locations to access;
   accessing the selected location of the memory device to complete the request;
   increasing, based on the type of the request to access the memory device, a temperature value of the map associated with the selected location to reflect heat generated by the access of the memory device, the temperature value of the map increased by a respective predefined heat increment associated with (i) the read request, (ii) the write request, or (iii) the erase request, at least two of the respective predefined heat increments being different; and
   applying a filter to the map of temperature values effective to estimate dissipation of heat from at least the selected location to other locations of the memory device.

2. The method as recited in claim 1, wherein selecting one of the two locations based on the respective temperatures is effective to minimize an increase in the memory device's temperature.

3. The method as recited in claim 1, wherein the first and second locations of the memory device are free locations and the method further comprises determining, from multiple locations of the memory device, that the first and second locations of the memory device are free.

4. The method as recited in claim 1, wherein the request is made via a logical address of the memory device and the method further comprises mapping the logical address of the request to the selected location of the memory device to enable completion of the request.

5. The method as recited in claim 1, wherein the memory device comprises a three-dimensional (3D) memory device or a two-dimensional (2D) memory device.

6. The method as recited in claim 1, wherein the filter applied to the map of temperature values is configured based on an optical function that is useful to predict or estimate dissipation of the heat between physical locations of the memory device.

7. The method as recited in claim 1 wherein the predefined heat increment associated with the read request is less than the predefined heat increment associated with the write request.

8. A System-on-Chip comprising:
   a memory interface through which locations of a memory device are accessible;
   a host interface configured to receive, from a host device, requests to access the memory device;
   computer-readable media configured to maintain a temperature map of respective temperature information for the memory device's locations;
   a memory access manager to implement operations comprising:
      receiving, via the host interface, a request to access the memory device, a type of the request being one of (i) a read request, (ii) a write request, or (iii) an erase request;
      determining the type of the request to access the memory device as one of (i) the read request, (ii) the write request, or (iii) the erase request;
      determining, by accessing the temperature map, respective temperatures of at least two of the memory device's locations;
      selecting, based on the respective temperatures of the at least two locations, one of the at least two locations;
      accessing, via the memory interface, the selected location of the memory device to complete the request of the host device;
      increasing, based on the type of the request to access the memory device, a temperature value of the map associated with the selected location to reflect heat generated by the access of the memory device, the temperature value of the map increased by a respective predefined heat increment associated with (i) the read request, (ii) the write request, or (iii) the erase request, at least two of the respective predefined heat increments being different; and
      applying a filter to the temperature map effective to estimate dissipation of heat from at least the selected location to other locations of the memory device.

9. The System-on-Chip as recited in claim 8, wherein the computer-readable media is further configured to maintain a map of respective occupation information for the memory device's locations and the operations implemented by the memory access controller further comprise determining which of the memory device's locations are available for access.

10. The System-on-Chip as recited in claim 8, wherein selecting one of the at least two locations based on the respective temperatures is effective to minimize an increase in the memory device's temperature.

11. The System-on-Chip as recited in claim 8, wherein the filter applied to the map of temperature values is configured based on an optical function that comprises one of a blurring function, Gaussian function, smoothing function, or saturation function.

12. The System-on-Chip as recited in claim 8, wherein the memory device comprises a three-dimensional (3D) memory device or a two-dimensional (2D) memory device.

13. The System-on-Chip as recited in claim 8, wherein the predefined heat increment associated with the read request is less than the predefined heat increment associated with the write request or the predefined heat increment associated with the erase operation.

14. One or more computer-readable memory devices storing processor-executable instructions that, responsive to execution by a hardware-based processor, implement a memory access manager to perform operations comprising:
   receiving a request to access a memory device, a type of the request being one of (i) a read request, (ii) a write request, or (iii) an erase request;
   determining the type of the request to access the memory device as one of (i) the read request, (ii) the write request, or (iii) the erase request;
   accessing, in response to the request, a map of temperature values for locations of the memory device to determine respective temperatures of a first location and a second location of the memory device;
   selecting, based on the respective temperatures of the first and second locations, which of the two locations to access;
   accessing the selected location of the memory device to complete the request;
   increasing, based on the type of the request to access the memory device, a temperature value of the map associated with the selected location to reflect heat generated by the access of the memory device, the temperature value of the map increased by a respective predefined heat increment associated with (i) the read request, (ii) the write request, or (iii) the erase request, at least two of the respective predefined heat increments being different; and
   applying a filter to the map of temperature values effective to estimate dissipation of heat from at least the selected location to other locations of the memory device.

15. The one or more computer-readable memory devices as recited in claim 14, wherein selecting one of the two locations based on the respective temperatures is effective to minimize an increase in the memory device's temperature.

16. The one or more computer-readable memory devices as recited in claim 14, wherein the first and second locations of the memory device are free locations and the memory access manager is further configured to perform operations that comprise determining, from multiple locations of the memory device, that the first and second locations of the memory device are free.

17. The one or more computer-readable memory devices as recited in claim 14, wherein the filter applied to the map of temperature values comprises a two-dimensional (2D) filter that is configured based on an optical function to predict or estimate heat dissipation through physical locations of the memory device.

18. The one or more computer-readable memory devices as recited in claim 17, wherein the optical function on which the 2D filter is based comprises one of a Gaussian function, a blurring function, a smoothing function, or a spreading function.

19. The one or more computer-readable memory devices as recited in claim 14, wherein the memory device comprises a three-dimensional (3D) memory device or a two-dimensional (2D) memory device.

20. The one or more computer-readable memory devices as recited in claim 14, wherein the predefined heat increment associated with the read request is less than the predefined heat increment associated with the write request or the predefined heat increment associated with the erase operation.

* * * * *